United States Patent [19]

Schofield

[11] Patent Number: 4,486,724

[45] Date of Patent: Dec. 4, 1984

[54] ACOUSTIC SURFACE WAVE DEVICE

[75] Inventor: John Schofield, Coulsdon, England

[73] Assignee: U.S. Philips Corporation, New York, N.Y.

[21] Appl. No.: 485,531

[22] Filed: Apr. 15, 1983

[30] Foreign Application Priority Data

Apr. 19, 1982 [GB] United Kingdom ................. 8211248

[51] Int. Cl.³ ........................ H03H 9/145; H03H 9/64
[52] U.S. Cl. .................................. 333/194; 333/154; 333/195; 333/196
[58] Field of Search ........................ 333/150–155, 333/193–196; 310/313 R, 313 A, 313 B, 313 C, 313 D

[56] References Cited

U.S. PATENT DOCUMENTS 4,205,285  5/1980  Dempsey et al. ........... 310/313 C X
4,333,065  6/1982  De Vries .................... 310/313 C X
4,420,728 12/1983  Bower ........................ 333/154 X Primary Examiner—Marvin L. Nussbaum
Attorney, Agent, or Firm—Bernard Franzblau

[57] ABSTRACT

An acoustic surface wave device using apodized interdigital transducers 32, 33, of the kind disclosed in DE 28 54 072 in which the ungrounded bus-bar 44 is inclined towards the transducer axis and a velocity compensation section 36 is provided formed by grounded dummy electrodes 37 arranged parallel to the array electrodes.

The improvement comprises locating a grounded bus-bar portion 38 adjacent the inwardly inclined bus-bar portion 44' so that the facing boundary edges are uniformly spaced in the axial direction, the inclination being such that either a minimum or a side-lobe of substantially reduced magnitude of the sin x/x response is directed axially.

21 Claims, 6 Drawing Figures

ACOUSTIC SURFACE WAVE DEVICE

The invention relates to an acoustic surface wave device including a body of piezoelectric material on one surface of which is formed an acoustic surface wave transducer comprising at least one apodized interdigital array of electrodes in which a first and second set of electrodes are respectively connected to a corresponding one of two opposite bus-bars such that, in operation, at least one bus-bar is ungrounded and is therefore capable of varying in voltage at signal frequency relative to a quasi-steady ground potential established on or about the electrode-bearing surface region of said body at least in the vicinity of said acoustic surface wave transducer, so that an acoustic surface wave directed along an acoustic surface wave propagation direction can be propagated or received via a communicating end of the acoustic surface wave transducer, that portion of ungrounded bus-bar which is adjacent a communicating end of the acoustic surface wave transducer being directed inwardly into the acoustic surface wave beam aperture substantially to the central axis of the apodized array. The transducer further includes a velocity compensation region comprising dummy electrodes parallel to the electrodes of the interdigital array and connected to a grounded busbar, the outer communicating end of the velocity compensation region being at right angles to the acoustic surface wave propagation direction. Such a device will be referred to herein as an acoustic surface wave device of the kind referred to.

An acoustic surface wave device of the kind referred to is disclosed in FIG. 2 of DE 28 54 072, and is a development of the general form of apodized interdigital transducer which can be employed in a filter arrangement as illustrated for example in FIG. 3.8 of page 71 of Acoustic Surface Waves edited by A.A. Oliner published 1978 by Springer-Verlag, in which an apodized launching transducer is coupled via a multistrip coupler to an apodized receiving transducer. The use of a multistrip coupler in that example enables unwanted signal transfer via bulk waves, which are also launched by interdigital electrode arrays, to be reduced or effectively removed. The multistrip coupler also enables both the launching and the receiving transducers to be apodized if desired to form a symmetrical arrangement.

An acoustic surface wave filter of this kind can be computed which, under ideal conditions, will satisfy a desired pass band response to within given approximations, by techniques employing Fourier synthesis and computer optimisation. Thus computer programs have been devised which will specify the required distribution and intensities of transducing elements along the transducer. In an apodized interdigital array, such elements are realised in practice by the overlap of adjacent electrodes one from each of two overlapping sets of interdigital electrodes, each set being connected to a corresponding one of two opposite bus-bars. The transducing magnitude of each element is a function mainly of the length at right angles to the acoustic surface wave propagation direction, of said overlap, although end effects and the effects of nearest neighbouring electrodes have also to be taken into account depending on the magnitude of the element under consideration.

The distribution of overlaps along an apodized transducer can conveniently be indicated in a diagrammatic representation by the overlap envelope which comprises a pair of lines drawn to follow the respective ends of the overlap between adjacent electrodes along the interdigital array. The outer limits of the overlap envelope, in a direction at right angles to the wave propagation direction, are used to define the boundaries of the acoustic aperture of the transducer.

In some cases it has been found that the rather long thin conductors extending from a side bus-bar to the central axis of the array introduces a disturbing amount of resistance in series with small transducing elements formed by short overlaps, and U.K. patent specification Nos. 1,430,725 and 1,512,686 describe arrangements in which this series resistive element can be reduced without distorting the wavefront of the acoustic surface wave being launched.

In a practical realisation of an acoustic surface wave filter it has been found that disturbing signals occur which are delayed relative to the direct passage of the main signal from the launching transducer to the receiving transducer. It will be apparent from consideration of the Fourier transform that the addition of such signals will cause the resultant phase and frequency characteristic of the filter to depart from the computed ideal.

The origins of many of these undesired delayed signals are well understood and solutions have been proposed for reducing their effects. For example the effects of reflections at the boundary of individual electrodes have been reduced by the use of double-electrodes and of dummy electrodes, the effects of reflection of the unwanted rearwardly directed wave by the change of surface density at the back of the transducer have been reduced for example, by cancellation, as disclosed in U.K. patent application GB 2000932A or by the application of absorbing material having a boundary set obliquely to the wave front, as disclosed in U.K. patent specification No. 1,574,062, and the effects of reflection from the edge of the piezoelectric body has been reduced by forming the edge obliquely to the wavefront and by the application of absorbing material to the surface between the edge and the transducer. Another source of undesired delay is the propagation of energy via another mode such as a bulk wave mode having a different velocity to that of acoustic surface waves. The use of the multistrip coupler for track changing, and the technique of roughening or grooving the underside of the crystal wafer normally forming the piezoelectric body, has enable the effects of bulk waves to be reduced.

A further form of undesired delay is that due to electrical breakthrough by capacitive coupling. This can be regarded as a negative delay relative to the normal surface wave propagation delay. Electrical breakthrough can be reduced by careful layout, design and suitable provision of screens connected to electrical ground.

Nevertheless, even when all such precautions have been taken, undesired delayed signals have been found to occur giving rise to an amount of group delay ripple within the pass-band which was unacceptably high for certain critical applications in, for example, broadcast colour television equipment. This effect is identified in DE 28 54 072, as being caused by contributions to the transmitted signal made by undesired transducing elements formed by those portions of the strip electrodes at the ends of the transducers, mainly the outer boundary edges that do not overlap one another, and will be referred to herein as edge elements. FIG. 2 of DE 28 54

072 proposes a way of overcoming the difficulty by inwardly directing the ungrounded bus-bar at the communicating end of the transducer to the central axis of the array, and providing a velocity compensation region of dummy electrodes parallel to the array electrodes adjacent the inwardly directed bus-bar.

Unfortunately it has been found from measurements that the arrangement therein disclosed does not provide the expected reduction in group delay ripple.

It is an object of the present invention to provide an improved acoustic surface wave device employing an acoustic surface wave transducer in the form of one or more apodized interdigital electrode arrays.

According to the invention there is provided an acoustic surface wave device of the kind referred to, characterized in that a grounded bus-bar portion is located adjacent the said inwardly directed portion of the ungrounded bus-bar situated within the acoustic aperture, and is spaced therefrom in the acoustic surface wave propagation direction by a substantially uniform distance. The facing boundary edges of the adjacent portions of ungrounded and grounded bus-bars situated within the communicating aperture of the transducer being inclined to the direction at right angles to the acoustic surface wave propagation direction so that the innermost and outermost ends of each respective said edge are correspondingly displaced relative to one another in the acoustic surface wave propagation direction by at least $0.8\lambda$, and the inclination of either said edge is at no point less than that of a notional straight line joining corresponding notional innermost and outermost points which are displaced in the propagation direction by $0.8\lambda$. The arrangement is such that the main response lobe, for undesired acoustic surface waves generated or received by an acoustic surface wave transducing element formed by said facing boundary edges of the bus-bars situated within the communicating aperture, is directed obliquely to the acoustic surface wave propagation direction.

The invention is based on the realisation that the unwanted transducing element formed between the outer edge of the inwardly directed ungrounded bus-bar portion and the nearest adjacent grounded conducting edge of the dummy electrodes in the arrangement of FIG. 2 of DE 28 54 072, does not in fact transduce principally in a direction normal to the inclined edge of the bus-bar, but has a relatively large directional component parallel to the transducer axis which results from those edge portions of the grounded dummy electrodes which are at right angles to the axis and which are exposed directly to the electric field extending from the sloping adjacent edge of the ungrounded bus-bar portion, and that the total effected summed across the acoustic aperture will cause a significant adverse disturbance of the group delay response. The inventive solution proposes that this adverse effect can be overcome by ensuring that the edge of a grounded conductor which is next adjacent to the outer edge of the inwardly sloping signal bus-bar portion, also has at all points a similar inclination to the direction perpendicular to the propagation axis as the said outer edge, and is conveniently a grounded bus-bar to which at least some of the grounded dummy electrodes forming the velocity compensation section can be directly electrically connected.

Thus, in an acoustic surface wave device in accordance with the invention, the undesired transducing element formed by the facing boundary edges of the ungrounded signal bus-bar portion and of the grounded bus-bar, respectively, is arranged to direct or to be responsive to acoustic surface waves in a direction inclined to the desired wave propagation direction and to have a substantially reduced or minimal response in the propagation direction for the array, while the desired acoustic surface wave beam is permitted to propagate along the desired direction substantially without wave front distortion.

In this way the edge element signal from the front, i.e. the communicating end, of an acoustic surface wave transducing array, which will be in advance of the main array signal, can be substantially reduced in magnitude. An edge element signal which can be similarly generated from the rear end-surfaces of the array, and which will be delayed relative to the main array signal, can also be reduced as described hereinafter.

A similar disturbing effect from a corresponding edge element at the rear of a transducer with a preferred communicating direction, can be reduced by ensuring that the rear portion of the or each signal driven bus-bar, is similarly directed inwardly towards the central axis of the array at an inclination of at least the minimum amount specified in respect of the facing boundary edges of the inwardly directed bus-bar portions adjacent the communicating end of the transducer.

An alternative arrangement which can reduce the effect of the rear boundary element is to extend the transducer in a rearward direction by means of dummy electrodes and to cover the dummy electrodes with acoustic surface wave absorbing material thus causing the undesired response to be attenuated. Because the usual computer program takes several nearest neighbour elements into account, this rearward extension of the array could also require a few dummy electrodes to be added to the communicating end of the array, namely to the velocity compensation section, in order to preserve the symmetry of the array, and hence maintain a linear phase delay with frequency.

When the outer edge element is rectilinear the usual $\sin x/x$ response will occur, and an inclination at which the ends of the element are spaced a distance $\lambda$ along the propagation path will direct the first null of the response along the propagation direction. This null is narrow, and although for relatively narrow band width devices it may be sufficient to use a minimum distance of $0.8\lambda$ at the appropriate side of the pass-band, a wide band device would preferably employ a larger angle of inclination such that the tenth or higher null is directed along the propagation direction, because the attenuated response will have to rely on the lowered peaks of the side lobes rather than the presence of a null.

In a practical device it is desirable that the facing boundary edges should not subtend too small an angle with the propagation axis. An inclination to the perpendicular to the propagation direction lying in the range 5 degrees to 80 degrees is therefore to be preferred.

In a preferred form of the device, the sum of the corresponding distances across the inwardly directed ungrounded bus-bar portion and across the adjacent grounded bus-bar at the communicating end of the transducer is made everywhere the same within the communicating aperture of the transducer, all the distances being measured parallel to the propagation direction.

In an embodiment of the device, the radio of said sum to the corresponding spacing between the edges of said bus-bars is made the same as the mean ratio of electrode width to spacing in the interdigital array.

The communicating aperture of the transducer is to be understood herein to mean that width dimension associated with the transducer within which any acoustic surface wave directed along the acoustic surface wave propagation direction can be launched so as to interact with another component of the device such as a multistrip coupler or, when launched by such a component (multistrip coupler or other transducer), can interact with any transducing element of the transducer including an outer boundary edge element.

The ungrounded signal bus-bar can be tapered towards the ends thereof enabling any unwanted portion of the end boundary running at right angles to the propagation direction, for example when connecting to a terminal electrode of the array, to be made as short as possible or eliminated.

In an acoustic surface wave filter device in accordance with the invention, it is preferable to make each transducer symmetrical and to make the receiving transducer symmetrically the same as the launching transducer so that the phase delay is more readily made linear, resulting in a more constant group delay. Since both transducers would be apodized they would have to be coupled by a multistrip coupler. Thus, in the case of a single ended signal connection to the launching or the receiving transducer, the bus-bar connected to the grounded set of electrodes would be similarly directed inwardly towards the central axis of the array and a corresponding bus-bar at the adjacent edge of the velocity compensation region would be similarly spaced from the grounded signal-electrode bus-bar in order to preserve symmetry.

Embodiments of the invention will now be described by way of example with reference to the accompanying drawings which:

Figure 1:
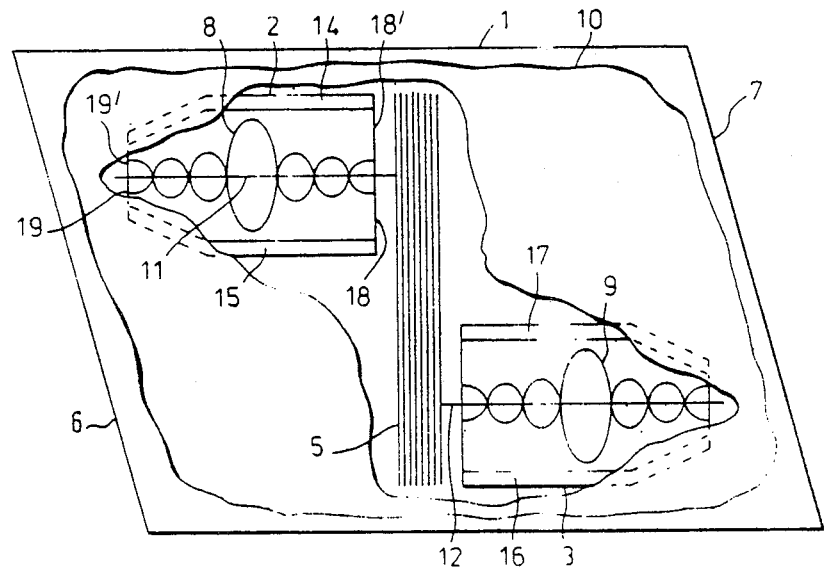
FIG. 1 illustrates diagrammatically a known form of acoustic surface wave filter device.

A known form of acoustic surface wave filter is illustrated in FIG. 1. and comprises a piezoelectric body 1, for example a rotated Y-cut X-propagating lithium niobate crystal wafer on a surface of which are located apodized interdigital launching and receiving arrays 2,3 coupled by a multistrip coupler 5. The overlap envelopes of the respective interdigital electrode pairs are indicated by the references 8 and 9. The unwanted acoustic surface wave launched in a direction away from the multistrip coupler 5 by the array 2 is at least partially absorbed by damping material 10 applied to the surface between the end of the transducer 2 and the edge 6. Acoustic wave energy incident at the edges 6 and 7 along the surface wave propagation direction 11, 12 is caused to be reflected obliquely to the propagation direction by inclining the edges 6 and 7 to the perpendicular to the wave propagation direction.

Figure 2:
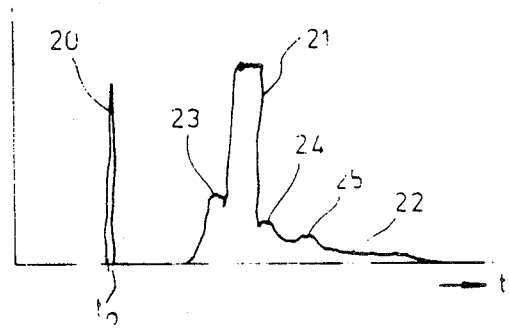
FIG. 2 is a graph representing the received response of the device of FIG. 1.

When a brief input signal pulse is applied to the launching transducer 2. the signal output from the receiving transducer 3 is found to take the form shown in the graph diagram of FIG. 2. The pulse 20 at $t_0$ indicates electrical breakthrough and is artificially increased during a delay test to provide a time zero reference. The main signal launched by the lauching transducer 2 and received by the receiving transducer 3 is indicated at 21. It will be apparent that while most of the after-signal at 22 is well down in amplitude relative to the main peak 21, quite a significant peak 23 leads the main signal, which is followed by a lesser peak 24. Two further signals 25 can also be discerned occurring later.

The peak 23 which precedes the main response is generated in part by the front boundary edge 18' of the set of electrodes connected via a bus-bar 14 to a source of signal voltage. The opposite bus-bar 15 is connected to ground in the present device as is the receiver array bus-bar 17 to minimise electrical breakthrough. Thus while the multistrip coupler is normaly left unconnected, the electrodes nearest to the array 2 will form part of a capacitance voltage divider between the signal electrode edge 18' and the grounded electrode edge 18. The resultant signal field will transduce acoustic surface waves whose wavefronts are perpendicular to the propagation direction 11 and, when generated, one will propagate to the right and the other to the left in FIG. 1.

A further wave will be generated by the edge 19' of the signal driven electrode at the rear of the array 2, and this is, in part, responsible for the second unwanted response 24.

Since any transducing element capable of launching an acoustic surface wave when driven by an appropriate electrical signal can also detect, i.e. generate an electrical signal in response to the passage of an acoustic surface wave, it will be apparent that the main pulse generated at the centre of the launching transducer 2 will be predetermined by a corresponding outer boundary edge element at the communicating end of the receiving transducer 3 before it generates the main response 21 in the central portion of the detector array, thus contributing to the response 23. As the main pulse propagates past the far end of the receiver array 3 it will once more be detected by a corresponding rear boundary edge element to contribute to the response 24.

The two further unwanted responses 25 are well down in amplitude and are respectively due to the main signal from the launching array 2, which in one case propagates to the left in FIG. 1 and is reflected at the rear of the array 2 before travelling to the receiving transducer 3, and in the other case, after generating the primary response 21, the main signal is reflected at the right hand end of the receiving transducer and passes back through the array. These minor responses 25 are however well controlled in the example shown because the ends of the bus-bars have been brought closer together in order to shorten the electrode connections to weak transducing elements at the rear of the array, and because of the application of damping medium 10 to the surface of the wafer.

Figure 3:
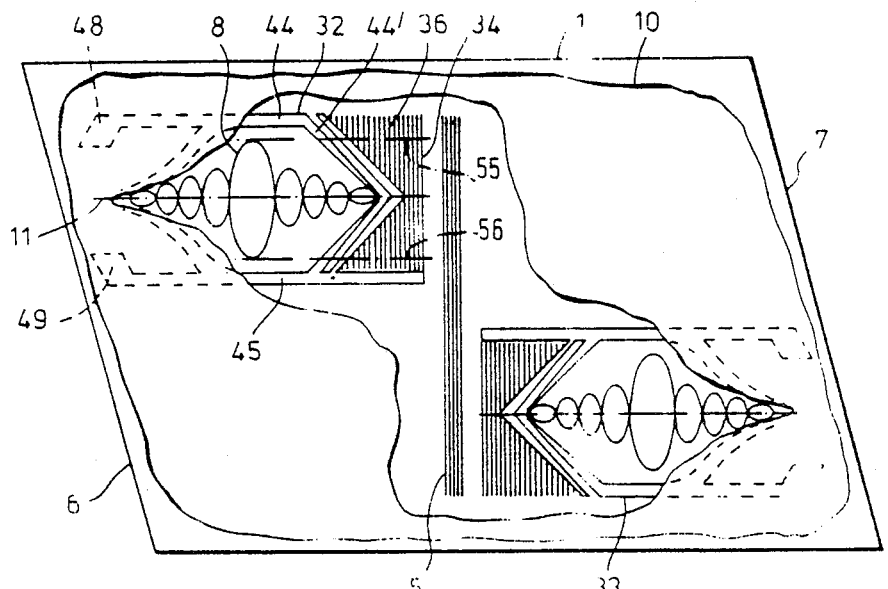
FIG. 3 illustrates an acoustic surface wave filter device embodying the invention.

An embodiment of the invention is shown in FIG. 3, in which a launching transducer 32, a receiving transducer 33 and a conventional multistrip coupler 5 are formed on the surface of a piezoelectric body, suitably a rotated Y-cut, X-propagating lithium niobate crystal wafer 1. The transducers 32, 33 and the multistrip coupler are formed suitably by photolithography from a vapour-deposited layer of metal.

The launching transducer 32 comprises an apodized interdigital array of two sets of electrodes in which the electrodes of each set are connected to a corresponding one of two opposite bus-bars 44, 45 having respective terminal connections 48, 49. In the present embodiment, the bus-bar 44 will be assumed to be connected to a source of signal voltage in operation and the bus-bar 45 will be connected to signal ground. The respective sets of electrodes and corresponding bus-bars 44, 45 can however, if desired, be driven in antiphase by a source of signal voltage, but in that case a further conductive material pattern connected to ground may be required adjacent the bus-bar 45 as a screen to reduce direct electrical breakthrough.

The electrodes comprising each of the two sets which make up the apodized interdigital array are not shown in detail because of the small width and spacing compared with the length of the array, but the overlap envelope of the length-weighted, i.e. apodized, array of transducing elements is indicated by the lines 8. The individual electrodes can suitably comprise double electrodes as described in a paper entitled "Applications of double electrodes in acoustic surface wave device design" by T. W. Bristol et al. presented to the Proc IEEE Ultrasonics Symposium, October 1972, in order to reduce adverse reflection effects from the electrodes. The spaces between the electrodes of a given set can be filled by dummy electrodes connected to the same bus-bar as the electrodes of the set as described in Applied Physics Letters, 1st December 1971, Volume 19, Number 11, at pages 456 to 459.

As disclosed in FIG. 2 of DE 28 54 072, that portion 44' of the signal bus bar 44 which is adjacent the communicating end 34 of the launching transducer 32, is directed inwardly into the acoustic aperture whose boundaries are indicated by the dashed lines 55, 56 substantially to the central axis 11 of the apodized array. The velocity compensation region 36 is provided comprising dummy electrodes 37 which are arranged parallel to the electrodes of the interdigital array forming the transducer 32. The dummy electrodes 37 are connected to ground.

In accordance with the invention, a grounded bus-bar 38, to which the dummy electrodes 37 are connected, is located adjacent the inwardly directed portion 44' of the ungrounded bus-bar 44. The spacing between the edge 35 of the signal bus-bar and the adjacent edge of the grounded bus-bar 38 is made substantially uniform in the acoustic surface wave propagation direction. Preferably, the ratio of the sum of the corresponding distances across the bus-bar portion 44' and across the adjacent grounded bus-bar 38, to the spacing between the edge 35 and the adjacent edge of the grounded bus-bar 38, all distances being measured along the acoustic surface wave propagation direction, is made the same as the mean ratio of electrode width to spacing in the launching array.

The bus-bar portion 44' is preferably tapered towards the end 39 thereof so that the short electrode 40 can be accommodated without the need for a connecting portion having an unwanted end boundary at right angles to the propagation direction. When the bus-bar 44' is tapered, the corresponding part of the bus-bar 38 should be tapered in the opposite direction so that the sum of the distances across the two bus-bars 44', 38, in the acoustic surface wave direction is everywhere the same within the acoustic aperture.

The facing boundary edges of the adjacent portions of the ungrounded bus-bar 44', namely 35, and of the grounded bus-bar 38, which are respectively situated not only within the acoustic wave beam aperture 55, 56, but also within the entire communicating aperture 57, 58 of the transducer, are each inclined to the transverse direction at right angles to the acoustic surface wave propagation direction along the axis 11 by an amount such that the respective innermost end, e.g. 39, and the corresponding outermost end, e.g. 50, both of which lie within the communicating aperture of the transducer, are displaced relative to one another in the acoustic surface wave propagation direction by a distance a which is at least $0.8\lambda$ within the passband of the device and is preferably several times that amount if a wide passband is required.

In practical devices the angle of inclination to the transverse direction can range from 5 degrees or less to 80 degrees. Above 80 degrees difficulties can arise in maintaining a given distance in the propagation direction between the adjacent edges of the signal bus-bar portion 44' and the grounded bus-bar 38.

As hereinbefore described, the angle selected in each case will depend on the required bandwidth of the device, and will either correspond to a mid-band null direction of the $\sin x/x$ response for a narrow band device, or to a suitable reduced $\sin x/x$ side-lobe amplitude in the case of a wide band device. Thus the angle will in general be dependent on the aperture bandwidth product. The inclination angle used in a practical device may be about 50 degrees. This ensures that the undesired acoustic surface wave generated by the edge element formed by the facing boundary edges will be directed obliquely and well away from the acoustic surface wave propagation direction which lies along the axis 11.

Figure 4:
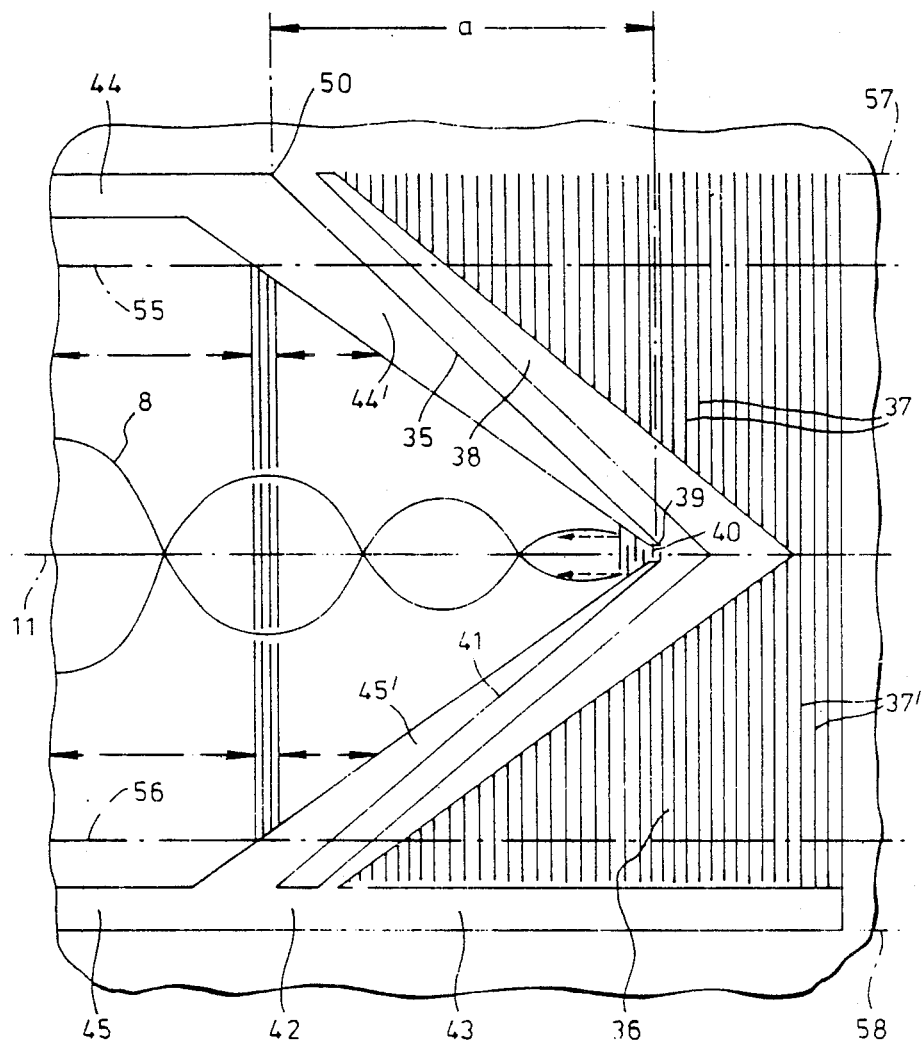
FIG. 4 is an enlarged view of a part of the device of FIG. 3.

As has been mentioned hereinbefore, it is preferable to maintain the symmetry of an interdigital array in order to maintain a linear phase-frequency response. Thus in the present embodiment, although the outer boundary edge 41 of the grounded bus-bar 45 cannot form an acoustic surface wave transducing element in conjunction with surrounding elements also at ground potential, it is nevertheless desirable to form the end 45' of the bus-bar 45 in a symmetrical manner with respect to the end 44' of the bus-bar 44, and to continue the grounded bus-bar 38 in a corresponding manner across the remainder of the acoustic aperture as shown in FIG. 4. The grounded bus-bar 38 is then conductively joined to the bus-bar 45 via a bridging section 42 and is continued forward parallel to the edge of the array to form a portion 43 to which the remaining dummy electrodes 37' of the velocity compensation region are connected.

Alternatively the front portion of the grounded bus-bar 45 can be differently arranged, if desired, provided that the wave front of the launched acoustic surface wave is not distorted thereby across the lower part of the acoustic aperture bounded by the axis 11 and the dashed line 56, and that the arrangement will not cause the phase-frequency response to fall outside the desired limits set for the device.

When it is desired to provide an antiphase signal drive to the two bus-bars 44 and 45, the arrangement shown in FIG. 3 must be employed, though with the bridging connection 42 broken because in this case both bus-bars 44 and 45 are driven by a signal voltage relative to ground potential.

In the present embodiment the rear portion 44" (see FIG. 5) of the signal driven bus-bar 44 is directed inwardly substantially to the central axis 11 of the apodized interdigital array and the outer boundary edge 46 is inclined in a similar manner as the edge 35 to the perpendicular to the acoustic surface wave propagation direction, i.e. the axis 11, so that undesired acoustic surface wave energy generated by the acoustic surface wave edge element formed along the boundary 46 is directed obliquely to the acoustic surface wave propagation direction. As in the case of the front boundary 35, the minimum inclination will depend in practice on the aperture-bandwidth product of the device concerned, but the distances a', b, b' between respective inner and outer ends of each edge along the propagation direction are made at least 0.8λ.

Acoustic surface wave damping medium 10 is applied to the surface of the wafer 1 to the rear of the transducer 32, and preferably is brought as close as practicable to the transducer without danger, during manufacture, of encroaching into the region occupied by the overlap portions of the interdigital electrodes.

The grounded bus-bar 45 is also brought in towards the central axis 11 to form a symmetrical arrangement about the axis 11.

The device of FIG. 3 is also provided with a multistrip coupler 5 and a receiving transducer 33. The receiving transducer is, for reasons of device symmetry, constructed in a similar manner to the launching transducer 32, and in order similarly to reduce the undesired signal response generated by the corresponding boundary edge elements at the front and rear outer boundaries of corresponding ungrounded bus-bars. It should also be understood that the oblique boundary of the rear portion of both bus-bars on the launching and receiving transducer will have the effect of directing any acoustic surface wave energy reflected at the transition from semi-metallisation to free surface away from the acoustic surface wave propagation direction to be scattered and absorbed by damping material 10 applied around the edge of the wafer surface.

Figure 6:
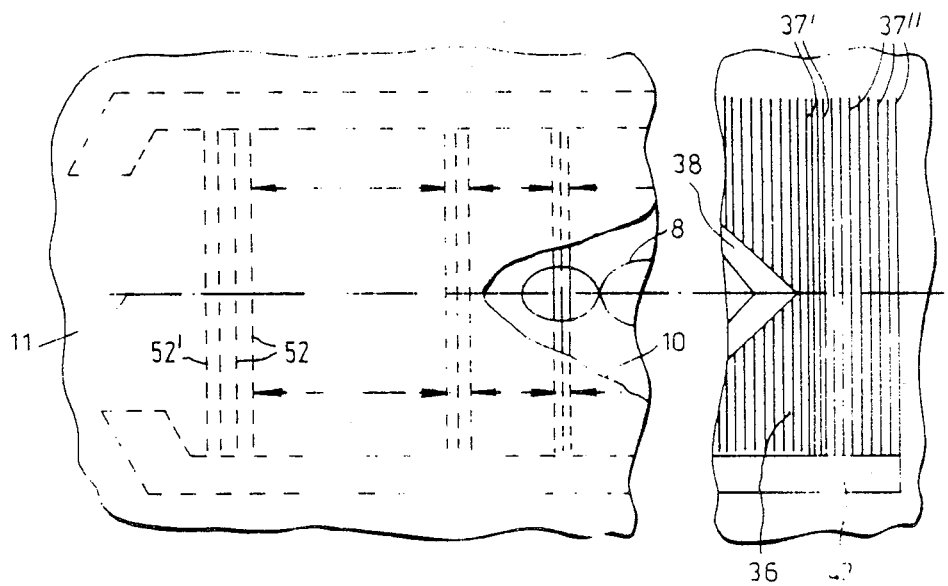
FIG. 6 represents an enlarged view of the parts of a modification of the embodiment of the invention.

FIG. 6 is an enlarged detail of the front and rear ends of a launching transducer forming a modification of the embodiment shown in FIG. 3. The modified device is otherwise as in FIGS. 3, 4 and 5. In FIG. 6, the effects of the edge element at the rear of the launching array is reduced in a different manner.

The signal bus-bar 44 and the grounded bus-bar 45 are extended rearwardly and are connected to corresponding dummy electrodes 52 which are arranged to extend the launching array in a direction opposite to the desired launching direction. The dummy electrodes 52 which extend towards the central axis 11 from both side bus-bars 44, 45, are covered with an acoustic surface wave damping medium 10, and the damping medium is preferably also applied to the non-overlapping portions of the interdigital electrodes towards the rear of the launching array 32. As a result, the undesired acoustic surface wave launched by the rear edge of the rearmost dummy electrode 52' in the acoustic surface wave propagation direction will be substantially attenuated by the damping medium 10 applied to the rear section before reaching the free propagation region of the launching array.

In the arrangement of FIG. 6, the addition of dummy electrodes to the rear of the launching array will upset slightly the computation of each array element which can involve as many as twelve nearest neighbours. Thus, in order to preserve the electrical symmetry of the array, it is desirable to add a few extra dummy electrodes 37" to the front of the velocity compensation region 36.

In the case too, the receiving transducer can have the same form as the launching transducer in order to preserve the symmetry of the device and to reduce the effect of the rear edge element.

A device has been described herein in which the acoustic surface wave transducers are each formed by a single apodized interdigital array of electrodes although a device can be constructed in accordance with the invention without a multistrip coupler if the other transducer is formed with electrodes of uniform length which extend across the acoustic aperture of the apodised transducer and the end electrodes of the uniform transducer are grounded.

Figure 5:
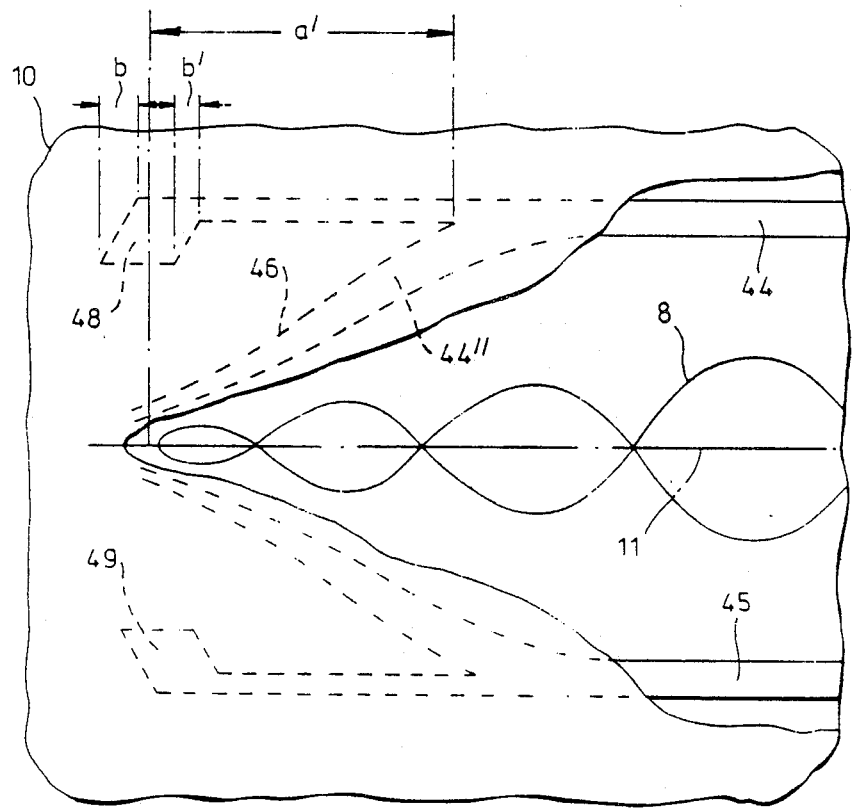
FIG. 5 is an enlarged view of a further part of the device of FIG. 3.

It is sometimes desired, for reasons of impedance matching with respect to drive or signal circuits and/or in order to reduce series resistive losses along the finger electrodes, to connect narrower interdigital arrays electrically in parallel. This can readily be effected, in the case of a device in accordance with the invention, by arranging two or more identical interdigital arrays as shown in FIGS. 4 and 5 or as in FIGS. 4 and 6 side by side directed along parallel paths towards a common multistrip coupler.

The embodiments herein described relate to devices in which an acoustic surface wave is only required to be launched and/or received in one direction. However, the invention is equally applicable to a device in which an acoustic surface wave is required to be launched and/or received in each of two opposite directions by a transducer comprising at least one apodized interdigital array. In such a case both ends of the transducer could be formed as shown in FIG. 4.

I claim:
1. An acoustic surface wave device comprising a body of piezoelectric material on one surface of which is formed an acoustic surface wave transducer including at least one apodized interdigital array of electrodes in which a first and second set of electrodes are respectively connected to a corresponding one of two opposite bus-bars such that, in operation, at least one bus-bar is ungrounded and is therefore capable of varying in voltage at signal frequency relative to a quasi-steady ground potential established on or about the electrode-bearing surface region of said body at least in the vicinity of said acoustic surface wave transducer, so that an acoustic surface wave directed along an acoustic surface wave propagation direction can be propagated or received via a communicating end of the acoustic surface wave transducer, that portion of an ungrounded bus-bar adjacent a communicating end of the acoustic surface wave transducer being directed inwardly into the acoustic surface wave beam aperture substantially to the central axis of the apodized array, said transducer further including a velocity compensation region comprising dummy electrodes parallel to the electrodes of the interdigital array and connected to a grounded bus-bar, the outer communicating end of the velocity compensation region being at right angles to the acoustic surface wave propagation direction, characterized in that a grounded bus-bar portion is located adjacent the said inwardly directed portion of the ungrounded bus-bar situated within the acoustic aperture and is uniformly spaced therefrom in the acoustic surface wave propagation direction, facing boundary edges of the adjacent portions of ungrounded and grounded bus-bars situated within the communicating aperture of the transducer being inclined to the direction at right angles to the acoustic surface wave propagation direction, so that the innermost and outermost ends of each respective said edge are correspondingly displaced relative to one another in the acoustic surface wave propagation direction by at least 0.8λ, and the inclination of either said edge is at no point less than that of a notional straight line joining corresponding notional innermost and outermost points which are displaced in the propagation direction by 0.8λ, the arrangement being such that the main response lobe, for undesired acoustic surface waves generated or received by an acoustic surface wave transducing element formed by said facing boundary edges of the bus-bars situated within the communicating aperture, is directed obliquely to the acoustic surface wave propagation direction.

2. A device as claimed in claim 1, wherein said facing boundary edges of said bus-bar portions, which are situated within the communicating aperture of the device, are rectilinear.

3. A device as claimed in claim 2 wherein said facing boundary edges of said bus-bar portions, situated within the communicating aperture of the device for acoustic surface waves, are inclined at an angle of at least 5 degrees and at most 80 degrees to the direction at right angles to the acoustic surface wave propagation direction.

4. A device as claimed in claim 2 wherein, in a direction parallel to the acoustic surface wave propagation direction, the sum of the corresponding distances across the inwardly directed ungrounded bus-bar portion and across the adjacent grounded bus-bar is constant within the communicating aperture.

5. A device as claimed in claim 2 wherein, in a direction parallel to the acoustic surface wave propagation direction, the ratio of the sum of the corresponding distances across the inwardly directed ungrounded bus-bar portion and across the adjacent grounded bus-bar, to the spacing between them, is the same as the mean ratio of electrode width to spacing in the acoustic surface wave array.

6. A device as claimed in claim 2 wherein the acoustic surface wave transducer is only required to communicate via one end of the transducer, that portion on an ungrounded bus-bar adjacent the non-communicating end of the acoustic surface wave transducer being directed inwardly substantially to the central axis of the apodized array, the outer boundary edge thereof being inclined to the perpendicular to the acoustic surface wave propagation direction at least by the minimum amount specified in respect of the facing boundary edges of the inwardly directed bus-bar portions adjacent the communicating end of the transducer.

7. A device as claimed in claim 2 wherein the acoustic surface wave transducer is only required to communicate via one end of the transducer, the acoustic surface wave transducer being extended at the end opposite to the communicating end by a plurality of dummy electrodes, and wherein the dummy electrode portion at the non-communicating end of the array is coated with a layer of acoustic surface wave absorbing material.

8. A device as claimed in claim 2 wherein that portion of an ungrounded bus-bar which is directed inwardly is tapered towards the central axis of the apodized array.

9. A device as claimed in claim 1 wherein said facing boundary edges of said bus-bar portions situated within the communicating aperture of the device for acoustic surface waves, are inclined at an angle of at least 5 degrees and at most 80 degrees to the direction at right angles to the acoustic surface wave propagation direction.

10. A device as claimed in claim 9 wherein, in a direction parallel to the acoustic surface wave propagation direction, the sum of the corresponding distances across the inwardly directed ungrounded bus-bar portion and across the adjacent grounded bus-bar is constant within the communicating aperture.

11. A device as claimed in claim 9 wherein, in a direction parallel to the acoustic surface wave propagation direction, the ratio of the sum of the corresponding distances across the inwardly directed ungrounded bus-bar portion and across the adjacent grounded bus-bar, to the spacing between them, is the same as the mean ratio of electrode width to spacing in the acoustic surface wave array.

12. A device as claimed in claim 9 wherein the acoustic surface wave transducer is only required to communicate via one end of the transducer, that portion of an ungrounded bus-bar adjacent the non-communicating end of the acoustic surface wave transducer being directed inwardly substantially to the central axis of the apodized array, the outer boundary edge thereof being inclined to the perpendicular to the acoustic surface wave propagation direction at least by the minimum amount specified in respect of the facing boundary edges of the inwardly directed bus-bar portions adjacent the communicating end of the transducer.

13. A device as claimed in claim 9 wherein the acoustic surface wave transducer is only required to communicate via one end of the transducer, the acoustic surface wave transducer being extended at the end opposite to the communicating end by a plurality of dummy electrodes, and wherein the dummy electrode portion at the non-communicating end of the array is coated with a layer of acoustic surface wave absorbing material.

14. A device as claimed in claim 9 wherein that portion of an ungrounded bus-bar which is directed inwardly is tapered towards the central axis of the apodized array.

15. A device as claimed in claim 1 wherein in a direction parallel to the acoustic surface wave propgation direction, the sum of the corresponding distances across the inwardly directed ungrounded bus-bar portion and across the adjacent grounded bus-bar is constant within the communicating aperture.

16. A device as claimed in claim 1 wherein in a direction parallel to the acoustic surface wave propagation direction, the ratio of the sum of the corresponding distances across the inwardly directed ungrounded bus-bar portion and across the adjacent grounded bus-bar, to the spacing between them, is the same as the mean ratio of electrode width to spacing in the acoustic surface wave array.

17. A device as claimed in claim 1 wherein the acoustic surface wave transducer is only required to communicate via one end of the transducer, that portion of an ungrounded bus-bar adjacent the non-communicating end of the acoustic surface wave transducer being directed inwardly substantially to the central axis of the apodized array, the outer boundary edge thereof being inclined to the perpendicular to the acoustic surface wave propagation direction at least by the minimum amount specified in respect of the facing boundary edges of the inwardly directed bus-bar portions adjacent the communicating end of the transducer.

18. A device as claimed in claim 1 wherein the acoustic surface wave transducer is only required to communicate via one end of the transducer, the acoustic surface wave transducer being extended at the end opposite to the communicating end by a plurality of dummy electrodes, and wherein the dummy electrode portion at the non-communicating end of the array is coated with a layer of acoustic surface wave absorbing material.

19. A device as claimed in claim 1 wherein that portion of an ungrounded bus-bar which is directed inwardly is tapered towards the central axis of the apodized array.

20. A device as claimed in claim 1 including a further similar acoustic surface wave transducer, and a multistrip coupler arranged on said surface so that acoustic surface wave energy launched by one said transducer along one path is substantially transferred by the multistrip coupler so as to propagate along a non-overlapping path and to be received via the acoustic aperture of the other said transducer.

21. A band-pass filter comprising a device as claimed in claim 20.

* * * * *

UNITED STATES PATENT AND TRADEMARK OFFICE
CERTIFICATE OF CORRECTION

PATENT NO. : 4,486,724

DATED : December 4, 1984

INVENTOR(S) : JOHN SCHOFIELD

It is certified that error appears in the above-identified patent and that said Letters Patent is hereby corrected as shown below:

Column 1, line 20, after "of" insert --an--; change "upgrounded" to --ungrounded--

Column 5, line 35, after "drawing" insert --in--

Column 7, line 36, change "The" to --A--

Column 10, line 4, change "the" (first occurrence) to --this--

Claim 6, line 3, change "on" to --of--

Claim 9, line 2, after "portions" insert --,-- (comma)

Signed and Sealed this

Twenty-second Day of October 1985

[SEAL]

Attest:

DONALD J. QUIGG

Attesting Officer

Commissioner of Patents and Trademarks—Designate